US012622307B2

(12) United States Patent
Theil et al.

(10) Patent No.: US 12,622,307 B2
(45) Date of Patent: May 5, 2026

(54) CONTROLLED GRAIN GROWTH FOR BONDING AND BONDED STRUCTURE WITH CONTROLLED GRAIN GROWTH

(71) Applicant: ADEIA SEMICONDUCTOR BONDING TECHNOLOGIES INC., San Jose, CA (US)

(72) Inventors: Jeremy Alfred Theil, Mountain View, CA (US); Cyprian Emeka Uzoh, San Jose, CA (US); Guilian Gao, Campbell, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 469 days.

(21) Appl. No.: 18/069,910

(22) Filed: Dec. 21, 2022

(65) Prior Publication Data

US 2024/0213191 A1 Jun. 27, 2024

Related U.S. Application Data

(60) Provisional application No. 63/293,300, filed on Dec. 23, 2021.

(51) Int. Cl.
*H01L 23/00* (2006.01)

(52) U.S. Cl.
CPC ............. *H01L 24/05* (2013.01); *H01L 24/03* (2013.01); *H01L 24/08* (2013.01); *H01L 24/80* (2013.01);

(Continued)

(58) Field of Classification Search
CPC ........... H01L 24/80; H01L 2224/80895; H01L 2224/08145; H01L 23/3735; H01L 25/50;
(Continued)

(56) References Cited

U.S. PATENT DOCUMENTS

| | | | |
|---|---|---|---|
| 4,939,568 A | 7/1990 | Kato et al. | |
| 4,998,665 A | 3/1991 | Hayashi | |

(Continued)

FOREIGN PATENT DOCUMENTS

| | | | |
|---|---|---|---|
| CN | 1112286 A | 11/1995 | |
| CN | 103531492 A | 1/2014 | |

(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.
(Continued)

*Primary Examiner* — Sonya McCall-Shepard
(74) *Attorney, Agent, or Firm* — Knobbe, Martens, Olson & Bear, LLP

(57) ABSTRACT

Disclosed is an element including a conductive feature at a contact surface of the element and a nonconductive region at the contact surface in which the conductive feature is at least partially embedded. The contact feature includes a conductive material and an amount of impurities at a grain boundary of the conductive material. The impurities have a non-alloying material that does not form an alloy with the conductive material at a bonding temperature.

27 Claims, 5 Drawing Sheets

(52) U.S. Cl.
CPC ............... *H01L 2224/03462* (2013.01); *H01L 2224/03616* (2013.01); *H01L 2224/05147* (2013.01); *H01L 2224/08145* (2013.01); *H01L 2224/80895* (2013.01); *H01L 2224/80896* (2013.01); *H01L 2924/3512* (2013.01)

(58) Field of Classification Search
CPC ......... H01L 25/0657; H01L 2224/0558; H01L 2224/16145; H01L 2924/01029; H01L 2224/81447; H01L 2924/0104; H01L 2224/29347; H01L 2924/01073; H01L 2224/13147; H01L 21/187; H01L 2224/83447; H01L 2224/84447; H01L 2224/13347; H01L 2224/4568; H01L 2224/0578; H01L 2224/0588; H01L 2224/13247; H01L 2224/4518; H01L 2224/4578; H01L 2224/4588; H01L 21/02672; H01L 21/02667; H01L 24/05; H01L 24/08; H01L 2224/80357; H01L 2224/8034; H01L 2224/05; H01L 2224/0807; H01L 21/0214; H01L 21/02164; H01L 21/0217; H01L 21/31111; H01L 21/3212; H01L 21/76807; H01L 21/7684; H01L 21/76843; H01L 21/76871; H01L 21/76877; H01L 21/76883; H01L 23/5226; H01L 23/528; H01L 23/53238; H01L 24/89; H01L 2224/0346; H01L 2224/03616; H01L 2224/05025; H01L 2224/05147; H01L 2224/05546; H01L 2224/05547; H01L 2224/05556; H01L 2224/05559; H01L 2224/0801; H01L 2224/08501; H01L 2224/215; H01L 2224/80896; H01L 2224/80948; H01L 2224/94; H01L 2225/06524; H01L 2924/01013; H01L 2924/01022; H01L 2924/01025; H01L 2924/01027; H01L 2924/01028; H01L 2924/01072; H01L 2224/08058; H01L 2224/08121; H01L 21/76838; H01L 23/522
See application file for complete search history.

(56) References Cited

U.S. PATENT DOCUMENTS

| | | | |
|---|---|---|---|
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,421,953 A | 6/1995 | Nagakubo et al. |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,516,727 A | 5/1996 | Broom |
| 5,610,431 A | 3/1997 | Martin |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,904,860 A | 5/1999 | Nagakubo et al. |
| 5,985,739 A | 11/1999 | Plettner et al. |
| 5,998,808 A | 12/1999 | Matsushita |
| 6,008,126 A | 12/1999 | Leedy |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |

| | | | |
|---|---|---|---|
| 6,117,784 A | 9/2000 | Uzoh |
| 6,123,825 A | 9/2000 | Uzoh et al. |
| 6,147,000 A | 11/2000 | You et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,374,770 B1 | 4/2002 | Lee |
| 6,409,904 B1 | 6/2002 | Uzoh et al. |
| 6,423,640 B1 | 7/2002 | Lee et al. |
| 6,433,402 B1 | 8/2002 | Wo et al. |
| 6,465,892 B1 | 10/2002 | Suga |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,660,564 B2 | 12/2003 | Brady |
| 6,667,225 B2 | 12/2003 | Hau-Riege et al. |
| 6,758,388 B1 | 7/2004 | Leholm et al. |
| 6,828,686 B2 | 12/2004 | Park |
| 6,837,979 B2 | 1/2005 | Uzoh et al. |
| 6,864,585 B2 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,962,835 B2 | 11/2005 | Tong et al. |
| 6,974,769 B2 | 12/2005 | Basol et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,126,212 B2 | 10/2006 | Enquist et al. |
| 7,193,423 B1 | 3/2007 | Dalton et al. |
| 7,238,919 B2 | 7/2007 | Kaneko et al. |
| 7,354,798 B2 | 4/2008 | Pogge et al. |
| 7,485,968 B2 | 2/2009 | Enquist et al. |
| 7,750,488 B2 | 7/2010 | Patti et al. |
| 7,803,693 B2 | 9/2010 | Trezza |
| 7,998,335 B2 | 8/2011 | Feeney et al. |
| 8,039,966 B2 | 10/2011 | Yang et al. |
| 8,101,858 B2 | 1/2012 | Hannour et al. |
| 8,168,532 B2 | 5/2012 | Haneda et al. |
| 8,183,127 B2 | 5/2012 | Patti et al. |
| 8,241,961 B2 | 8/2012 | Kim et al. |
| 8,242,600 B2 | 8/2012 | Yang et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,728,934 B2 | 5/2014 | Uzho et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,000,600 B2 | 4/2015 | Uzoh et al. |
| 9,028,755 B2 | 5/2015 | Itoh |
| 9,093,350 B2 | 7/2015 | Endo et al. |

(56)  References Cited

U.S. PATENT DOCUMENTS

| | | | |
|---|---|---|---|
| 9,123,703 B2 | 9/2015 | Uzoh et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,190,345 B1 | 11/2015 | Chen et al. |
| 9,190,375 B2 | 11/2015 | Ayotte et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,318,385 B2 | 4/2016 | Uzoh et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,433,093 B2 | 8/2016 | Uzoh |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,633,971 B2 | 4/2017 | Uzoh |
| 9,656,852 B2 | 5/2017 | Cheng et al. |
| 9,666,573 B1 | 5/2017 | Sukekawa |
| 9,723,716 B2 | 8/2017 | Meinhold |
| 9,728,521 B2 | 8/2017 | Tsai et al. |
| 9,741,620 B2 | 8/2017 | Uzoh et al. |
| 9,776,270 B2 | 10/2017 | Ayotte et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,262,963 B2 | 4/2019 | Enquist |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,314,175 B2 | 6/2019 | Sato et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,908,173 B2 | 2/2021 | Yamasaki et al. |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,515,279 B2 | 11/2022 | Uzoh et al. |
| 11,769,747 B2 | 9/2023 | Sawada et al. |
| 11,908,739 B2 | 2/2024 | Uzoh |
| 12,046,571 B2 | 7/2024 | Uzoh et al. |
| 12,100,676 B2 | 9/2024 | Uzoh et al. |
| 12,132,020 B2 | 10/2024 | Uzoh et al. |
| 12,154,880 B2 | 11/2024 | Uzoh |
| 2002/0000328 A1 | 1/2002 | Motomura et al. |
| 2002/0003307 A1 | 1/2002 | Suga |
| 2002/0025665 A1 | 2/2002 | Juengling |
| 2002/0047208 A1 | 4/2002 | Uzoh et al. |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0052390 A1 | 3/2004 | Morales et al. |
| 2004/0052930 A1 | 3/2004 | Basol et al. |
| 2004/0084414 A1 | 5/2004 | Sakai et al. |
| 2004/0238492 A1 | 12/2004 | Catabay et al. |
| 2006/0024950 A1 | 2/2006 | Choi et al. |
| 2006/0057945 A1 | 3/2006 | Hsu et al. |
| 2006/0220197 A1 | 10/2006 | Kobrinsky et al. |
| 2007/0096294 A1 | 5/2007 | Ikeda et al. |
| 2007/0111386 A1 | 5/2007 | Kim et al. |
| 2008/0073795 A1 | 3/2008 | Kohl et al. |
| 2008/0122092 A1 | 5/2008 | Hong |
| 2008/0237053 A1 | 10/2008 | Andricacos et al. |
| 2009/0197408 A1 | 8/2009 | Lehr et al. |
| 2009/0200668 A1 | 8/2009 | Yang et al. |
| 2010/0255262 A1 | 10/2010 | Chen et al. |
| 2010/0327443 A1 | 12/2010 | Kim |
| 2011/0074040 A1 | 3/2011 | Frank et al. |
| 2011/0076787 A1 | 3/2011 | Ahmad et al. |
| 2011/0084403 A1 | 4/2011 | Yang et al. |
| 2012/0211894 A1 | 8/2012 | Aoyagi |
| 2012/0212384 A1 | 8/2012 | Kam et al. |
| 2013/0009321 A1 | 1/2013 | Kagawa et al. |
| 2013/0020704 A1 | 1/2013 | Sadaka |
| 2013/0221527 A1 | 8/2013 | Yang et al. |
| 2013/0252399 A1 | 9/2013 | Leduc |
| 2014/0153210 A1 | 6/2014 | Uzoh |
| 2014/0175655 A1 | 6/2014 | Chen et al. |
| 2014/0191418 A1* | 7/2014 | Cheng ..................... H01L 24/83 |
| | | 427/98.8 |
| 2014/0225258 A1 | 8/2014 | Chiu et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0206840 A1 | 7/2015 | Lin et al. |

(56) References Cited

U.S. PATENT DOCUMENTS

| | | |
|---|---|---|
| 2015/0279888 A1 | 10/2015 | Chen et al. |
| 2015/0340269 A1 | 11/2015 | Rivoire et al. |
| 2015/0364434 A1 | 12/2015 | Chen et al. |
| 2015/0380368 A1 | 12/2015 | Momose et al. |
| 2016/0020183 A1 | 1/2016 | Chuang et al. |
| 2016/0133598 A1 | 5/2016 | Baudin et al. |
| 2016/0276383 A1 | 9/2016 | Chuang et al. |
| 2016/0343682 A1 | 11/2016 | Kawasaki |
| 2017/0025381 A1 | 1/2017 | Tsai et al. |
| 2017/0047307 A1 | 2/2017 | Uzoh |
| 2017/0069575 A1 | 3/2017 | Haba et al. |
| 2017/0086320 A1 | 3/2017 | Barber |
| 2017/0141079 A1 | 5/2017 | Kao et al. |
| 2017/0194271 A1 | 7/2017 | Hsu et al. |
| 2017/0271242 A1 | 9/2017 | Lo et al. |
| 2017/0330855 A1 | 11/2017 | Tung et al. |
| 2017/0355040 A1 | 12/2017 | Utsumi et al. |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0350674 A1 | 12/2018 | Uzoh |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0244909 A1 | 8/2019 | Chiu et al. |
| 2019/0265411 A1 | 8/2019 | Huang et al. |
| 2019/0295954 A1 | 9/2019 | Nomura et al. |
| 2019/0319007 A1 | 10/2019 | Uzoh et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0098711 A1 | 3/2020 | Choi et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0258857 A1 | 8/2020 | Huo et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0028136 A1 | 1/2021 | Said et al. |
| 2021/0028144 A1 | 1/2021 | Lu |
| 2021/0098359 A1 | 4/2021 | Vreeland et al. |
| 2021/0098411 A1 | 4/2021 | Liff et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0234070 A1 | 7/2021 | Brueck et al. |
| 2021/0242050 A1 | 8/2021 | Chiu |
| 2021/0242152 A1 | 8/2021 | Fountain, Jr. et al. |
| 2021/0257333 A1 | 8/2021 | Yan |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |
| 2022/0139869 A1 | 5/2022 | Gao et al. |
| 2022/0139975 A1 | 5/2022 | Kimura et al. |
| 2022/0149002 A1 | 5/2022 | Hou et al. |
| 2022/0157752 A1 | 5/2022 | Bourjot et al. |
| 2022/0165692 A1 | 5/2022 | Uzoh et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005849 A1 | 1/2023 | Chuang |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0120352 A1 | 4/2023 | Lien et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0268307 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |

(56) References Cited

U.S. PATENT DOCUMENTS

| | | |
|---|---|---|
| 2024/0203917 A1 | 6/2024 | Katkar et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0022752 A1 | 1/2025 | Uzoh |
| 2025/0054854 A1 | 2/2025 | Katkar et al. |
| 2025/0079364 A1 | 3/2025 | Uzoh et al. |
| 2025/0087616 A1 | 3/2025 | Uzoh |
| 2025/0096172 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |

FOREIGN PATENT DOCUMENTS

| | | |
|---|---|---|
| CN | 106711131 A | 5/2017 |
| CN | 107256852 B | 9/2019 |
| JP | 2000-183061 | 6/2000 |
| JP | 2002-353416 A | 12/2002 |
| JP | 2013-033786 A | 2/2013 |
| JP | 2016-21497 A | 2/2016 |
| JP | 2018-129475 | 8/2018 |
| JP | 2018-160519 | 10/2018 |
| KR | 10-2008-0050129 | 6/2008 |
| KR | 10-2016-0066272 | 6/2016 |
| WO | WO 2005/043584 A2 | 5/2005 |
| WO | WO 2009/021266 A1 | 2/2009 |
| WO | WO 2022/147429 A1 | 7/2022 |

OTHER PUBLICATIONS

Basol et al., "Study on the Mechanism of Electrochemical Mechanical Deposition of Copper Layers,"Nu Tool Inc., 1655 McCandless Drive, Milpitas, CA 95035, Electrochemical Processes in ULSI and MEMS, Proceedings of the International Symposium; Proceedings vol. 2004-17, pp. 155-160.

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of the Electrochemical Society, 2011, vol. 158, No. 6, pp. P81-P86.

Ganesan, Kousik, "Capable copper electrodeposition process for integrated circuit—substrate packaging manufacturing," A disser-tation presented in partial fulfillment of the requirments for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrustion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.

Huang, Q., "Effects of impurity elements on isothermal grain growth of electroplated copper," Journal of the Electrochemical Society, 2018, vol. 165, No. 7, pp. D251-D257.

Huang, Q., "Impurities in the electroplated sub-50 nm Cu lines: The effects of the plating additives," Journal of the Electrochemical Society, 2014, vol. 161, No. 9, pp. D388-D394.

Jiang, T. et al., "Plasticity mechanism for copper extrusion in through-silicon vias for three-dimensional interconnects," Applied Physics Letters, 2013, vol. 103, pp. 211906-1-211906-5.

Juang, Jing-Ye et al., "Copper-to-copper direct bonding on highly (111)-oriented nanotwinned copper in no-vacuum ambient," Scientific Reports, Sep. 17, 2018, vol. 8, 11 pages.

Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.

Khan, Muhammed et al., "Damascene Process and Chemical Mechanical Planarization," http://www.ece.umd.edu/class/enee416/GroupActivities/Damascene%20Presentation.pdf, 25 pages.

Kim, Myung Jun et al., "Characteristics of pulse-reverse electrodeposited Cu thin film," I. Effects of Anodic Step in the Absence of an Organic Additives, Journal of the Electrochemical Society, 2012, vol. 159, No. 9, pp. D538-D543.

Kim, Myung Jun et al., "Characteristics of pulse-reverse electrodeposited Cu thin film," II. Effects of Organic Additives, Journal of the Electrochemical Society, 2012, vol. 159, No. 9, pp. D544-D548.

Liu, C. et al., "Low-temperature direct copper-to-copper bonding enabled by creep on (111) surfaces of nanotwinned Cu," Scientific Reports, May 12, 2015, 5:09734, pp. 1-11.

Liu, Chien-Min et al., "Effect of grain orientations of Cu seed layers on the growth of <111>-oriented nanotwinned Cu," Scientific Reports, 2014, vol. 4, No. 6123, 4 pages.

Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.

Lu, L. et al., "Grain growth and strain release in nanocrystalline copper," Journal of Applied Physics, vol. 89, Issue 11, pp. 6408.

Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.

Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.

Moriceau, H. et al., "Overview of recent direct wafer bonding advances and applications," Advances in Natural Sciences—Nanoscience and Nanotechnology, 2010, 11 pages.

Mott, D. et al., "Synthesis of size-controlled and shaped copper nanoparticles," Langmuir, 2007, vol. 23, No. 10, pp. 5740-5745.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

Ortleb, Thomas et al., "Controlling macro and micro surface topography for a 45nm copper CMP process using a high resolution profiler," Proc. of SPIE, 2008, vol. 6922, 11 pages.

(56) References Cited

OTHER PUBLICATIONS

Parthasaradhy, N.V., "Practical Electroplating Handbook," 1989, Prentice-Hall, Inc., pp. 54-56.

Plobi, A. et al., "Wafer direct bonding: tailoring adhesion between brittle materials," Materials Science and Engineering Review Journal, 1999, R25, 88 pages.

Saraswat, Stanford Presentation, Cu Interconnect slides, web page web.stanford.edu/class/ee311/NOTES/Cu_Interconnect_Slides.pdf, 19 pages.

Song, Xiaohui, "Atomic study of copper-copper bonding using nanoparticles," Journal of Electronic Packaging, Jun. 2020, vol. 142, 5 pages.

Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Swingle, Karen D., "Nanograin Copper Deposition Using an Impinging Jet Electrode," A Thesis submitted in partial satisfaction of the requirements of the degree of Master of Science, University of California, San Diego, 2013, 102 pages.

Takahashi, K. et al., "Transport phenomena that control electroplated copper filling of submicron vias and trenches," Journal of the Electrochemical Society, 1999, vol. 146, No. 12, pp. 4499-4503.

Zheng, Z. et al., "Study of grain size effect of Cu metallization on interfacial microstructures of solder joints," Microelectronics Reliability, 2019, vol. 99, pp. 44-51.

Basol et al, "Electrochemical mechanical deposition (ECMDT technique for semiconductor interconnect applications," Microelectronic Engineering, 2002, vol. 64, pp. 43-51.

Basol et al., "Planar copper plating and electropolishing techniques," Chemical Engineering Communication, Jul. 2006, 14 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

International Search Report and Written Opinion for PCT/US2022/082186, dated May 2, 2023, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, Electronics Weekly.com ("Bush article"); however, the imaged part and the part shown in the Bush article share the part No. "Onsemi AR0820."

Roy, A. et al., "Annealing effects on the surface properties of Cu—TiC thin films," Materials Today: Proceedings, 2021, vol. 44, Part 1, pp. 170-175.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Zik, N. et al., "Thermally produced nano catalyst for biodiesel production: A review," Journal of Advanced Research in Fluid Mechanics and Thermal Sciences, 2018, vol. 52, Issue 2, pp. 139-147.

Berla et al., "A Model for Power Law Creep Controlled Hillock Growth". Materials Science and Engineering: A. Aug. 15, 2008;488(1-2): 594-600.

Chen et al., "Wafer Level Bonding Using Localized Radio-Frequency Induction Heating". Science China Technological Sciences. May 2010;53: 1252-1257.

Chiu et al., "Low-Temperature Wafer-to-Wafer Hybrid Bonding by Nanocrystalline Copper". In 2022 IEEE 72nd Electronic Components and Technology Conference (ECTC) May 31, 2022 (pp. 679-684).

Classone Technologies, "Copper RDL Plating"—Using the Solstice® CopperMax™ Reactor, downloaded from https://classone.com/electroplating/copper-rdl-plating/ on Sep. 11, 2024; 3 pages.

Das et al., "Theory of welding of metallic parts in microwave cavity applicator," Fundamental J. Modern Physics. 2012;3(2): 125-155.

Diehm et al., "Low temperature processing of highly integrated assemblies by selective microwave heating". 2006 1st Electronic Systemintegration Technology Conference, Dresden, Germany, 2006, pp. 608-611, doi: 10.1109/ESTC.2006.280066.

Ericson et al., A transmission electron microscopy study of hillocks in Thin Aluminum Films. J Vac Sci Technol. B: Jan. 1, 1991;9(1): 58-63.

Hofmann et al., "Localized Induction Heating of Cu—Sn Layers for Rapid Solid-Liquid Interdiffusion Bonding Based on Miniaturized Coils," Micromachines. Aug. 12, 2022;13(8): 1307 in 24 pages.

Hu et al., "Two-Step $Ar/N_2$ Plasma-Activated Al Surface for Al—Al Direct Bonding". In 2022 IEEE 72nd Electronic Components and Technology Conference (ECTC) May 31, 2022 (pp. 324-329); doi: 10.1109/ECTC51906.2022.00060.

Hwang et al., "A Model for Hillock Growth in Al Thin Films Controlled by Plastic Deformation," Acta Materialia. Sep. 1, 2007;55(15): 5297-5301.

Hwang et al., "Effect of Film Thickness and Annealing Temperature on Hillock Distributions in Pure Al Films," Scripta materialia. Jan. 1, 2007;56(1): 17-20.

Iwai, T. et al., "Influence of microwave annealing on optical and electrical properties of plasma-induced defect structures in Si substrate," Journal of Vacuum Science & Technology A, 2015, vol. 33, Issue 6, pp. 061403-1-061403-9.

Iwamura et al., "Effect of Aluminum Oxide Caps on Hillock Formation in Aluminum Allow Films," Thin Solid Films. Jul. 30, 1999;349(1-2): 191-198.

Kimura, M. et al., "Investigation of implantation damage recovery using microwave annealing for high performance image sensing devices," ITE Trans. on MTA, 2016, vol. 4, No. 2, pp. 85-90.

Kowalski et al., "Microwave annealing for low temperature activation". In 2007 15th International Conference on Advanced Thermal Processing of Semiconductors Oct. 2, 2007 (pp. 51-56). IEEE.

Lee, I.K. et al., "Microwave annealing effect for highly reliable biosensor: dual-gate ion-sensitive field-effect transistor using amorphous InGaZnO thin-film transistor," ACS Appl Mater Interfaces, Dec. 2014, vol. 6, No. 24, pp. 22680-22686.

Mori E., "Suppression of Byproduct Accumulation in Rechargeable Aluminum-Air Batteries Using Non-Oxide Ceramic Materials as Air Cathode Materials". Sustainable Energy & Fuels. 2017;1(5): 1082-1089.

Pankratov, E.L., "Redistribution of dopant during microwave annealing of a multilayer structure for production p-n junction," Journal of Applied Physics, 2008, vol. 103, Issue 6, pp. 064320-1-064320-10.

Rebhan et al., "Low-Temperature Aluminum-Aluminum Wafer Bonding". ECS Transactions. Aug. 24, 2016;75(9): 15; 10 pages.

Santoro C.J., "Thermal Cycling and Surface Reconstruction in Aluminum Thin Films". Journal of the Electrochemical Society. Mar. 1, 1969;116(3):361-364.

(56) References Cited

OTHER PUBLICATIONS

Zhang, Q.X. et al., "The effects of rapid thermal annealing and microwave annealing on the electrical properties of ZrO2 metal-insulator-metal capacitors," Optik, Feb. 2019, vol. 179, pp. 1057-1062.

* cited by examiner

CONTROLLED GRAIN GROWTH FOR BONDING AND BONDED STRUCTURE WITH CONTROLLED GRAIN GROWTH

CROSS-REFERENCE TO RELATED APPLICATIONS

This application claims priority under 35 U.S.C. § 119(e) to U.S. Provisional Patent Application No. 63/293,300, filed Dec. 23, 2021, titled "CONTROLLED GRAIN GROWTH FOR BONDING AND BONDED STRUCTURE WITH CONTROLLED GRAIN GROWTH," the entire contents of which are hereby incorporated by reference herein in their entirety and for all purposes.

BACKGROUND

Field

The field relates to a conductive feature with controlled grain growth.

Description of the Related Art

Semiconductor elements, such as integrated device dies or chips, may be mounted or stacked on other elements. For example, a semiconductor element can be mounted to a carrier, such as a package substrate, an interposer, a reconstituted wafer or element, etc. As another example, a semiconductor element can be stacked on top of another semiconductor element, e.g., a first integrated device die can be stacked on a second integrated device die. Each of the semiconductor elements can have conductive pads for mechanically and electrically bonding the semiconductor elements to one another. There is a continuing need for improved methods for forming the conductive pads for reliable bonding.

BRIEF DESCRIPTION OF THE DRAWINGS

The detailed description is set forth with reference to the accompanying figures. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

Figures 1A, 1B, 1C:
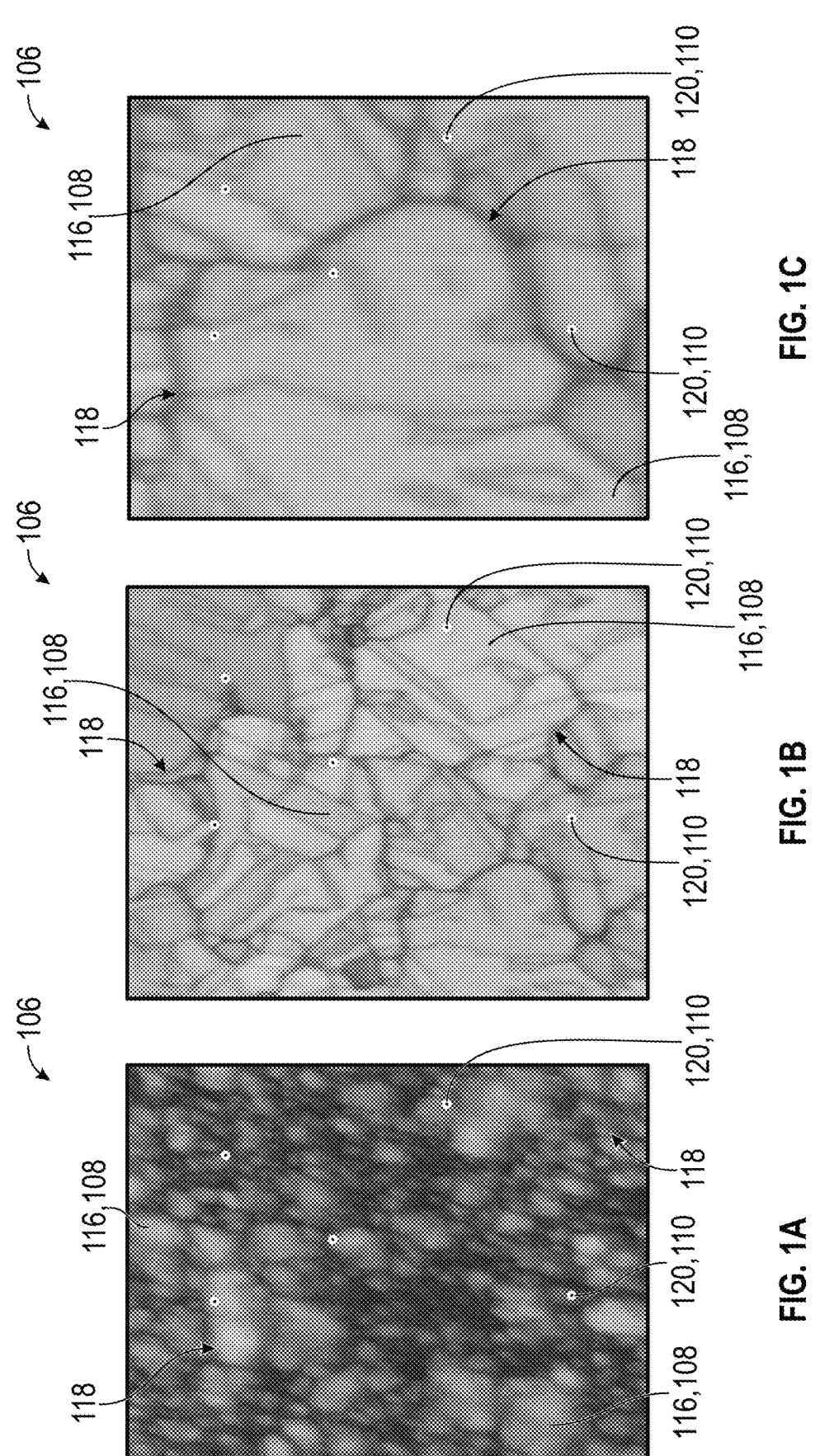

These aspects and others will be apparent from the following description of preferred embodiments and the accompanying drawings, which are meant to illustrate and not to limit the invention, wherein:

FIG. 1A is an image of metal (e.g., copper) grain structures that are representative of a conductive feature with relatively low or minimum impurity concentrations, shown after plating, with impurities schematically illustrated, according to one embodiment.

FIG. 1B is a representation of the grain structure shown in FIG. 1A, but shown just before annealing, according to one embodiment.

FIG. 1C is a representation of the grain structure shown in FIG. 1A, but shown after annealing, according to one embodiment.

Figures 2A, 2B, 2C:
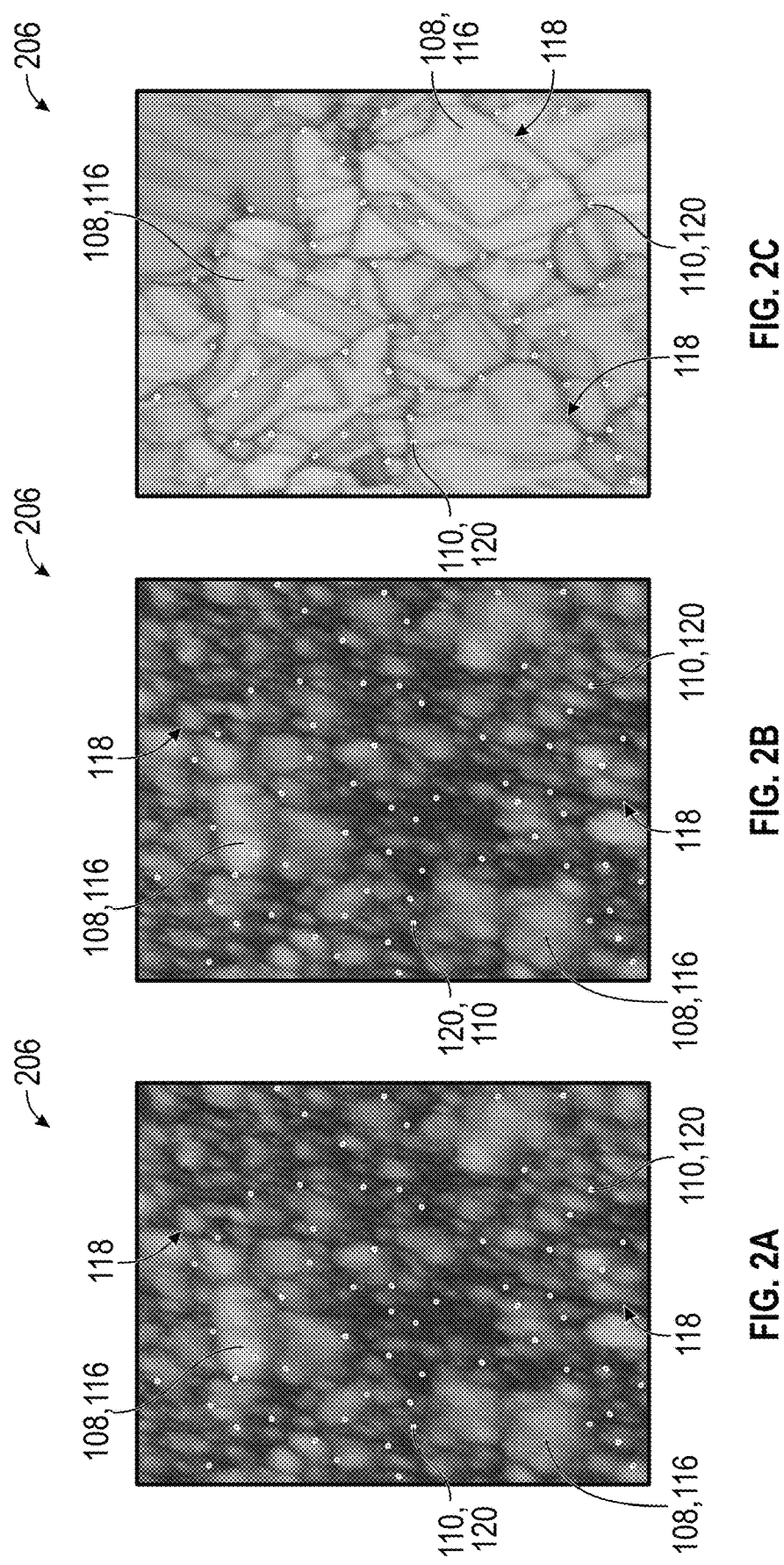

FIG. 2A is an image of metal (e.g., copper) grain structures that are representative of a conductive feature having impurity concentrations selected to manage grain growth, shown after plating, with impurities schematically illustrated, according to one embodiment.

FIG. 2B is a representation of the grain structure shown in FIG. 2A, but shown just before annealing, according to one embodiment.

FIG. 2C is a representation of the grain structure shown in FIG. 2A, but shown after annealing, according to one embodiment.

Figures 3A, 3B, 3C:
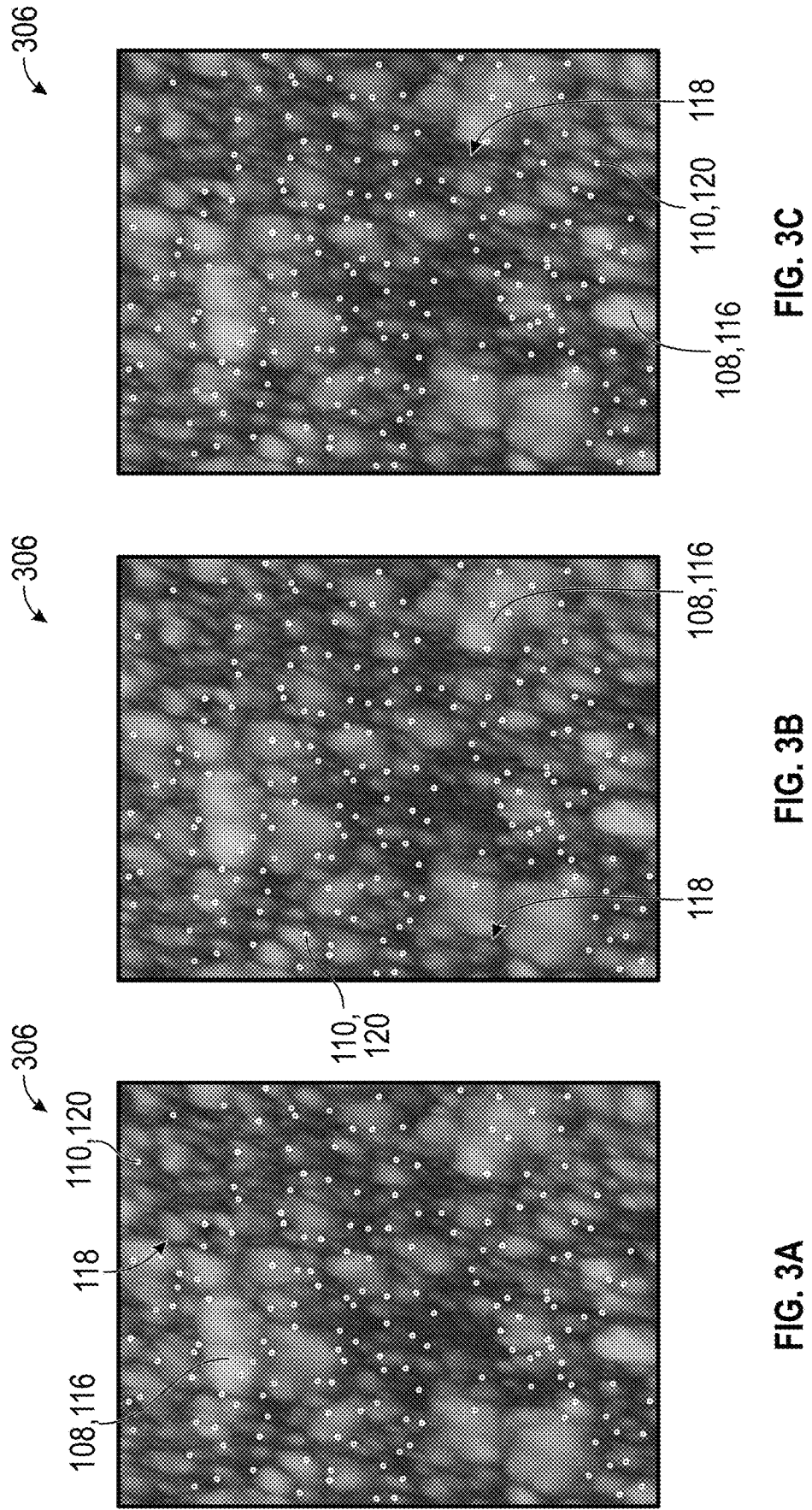

FIG. 3A is an image of metal (e.g., copper) grain structures that are representative of a conductive feature with relatively high impurity concentrations, shown after plating, with impurities schematically illustrated, according to one embodiment.

FIG. 3B is a representation of the grain structure shown in FIG. 3A, but shown just before annealing, according to one embodiment.

FIG. 3C is a representation of the grain structure shown in FIG. 3A, but shown after annealing, according to one embodiment.

FIGS. 4A-4D present a series of schematic side sectional views that show a multi-step method by which an element can be formed, according to one embodiment.

Figures 4A, 4B, 4C, 4D:
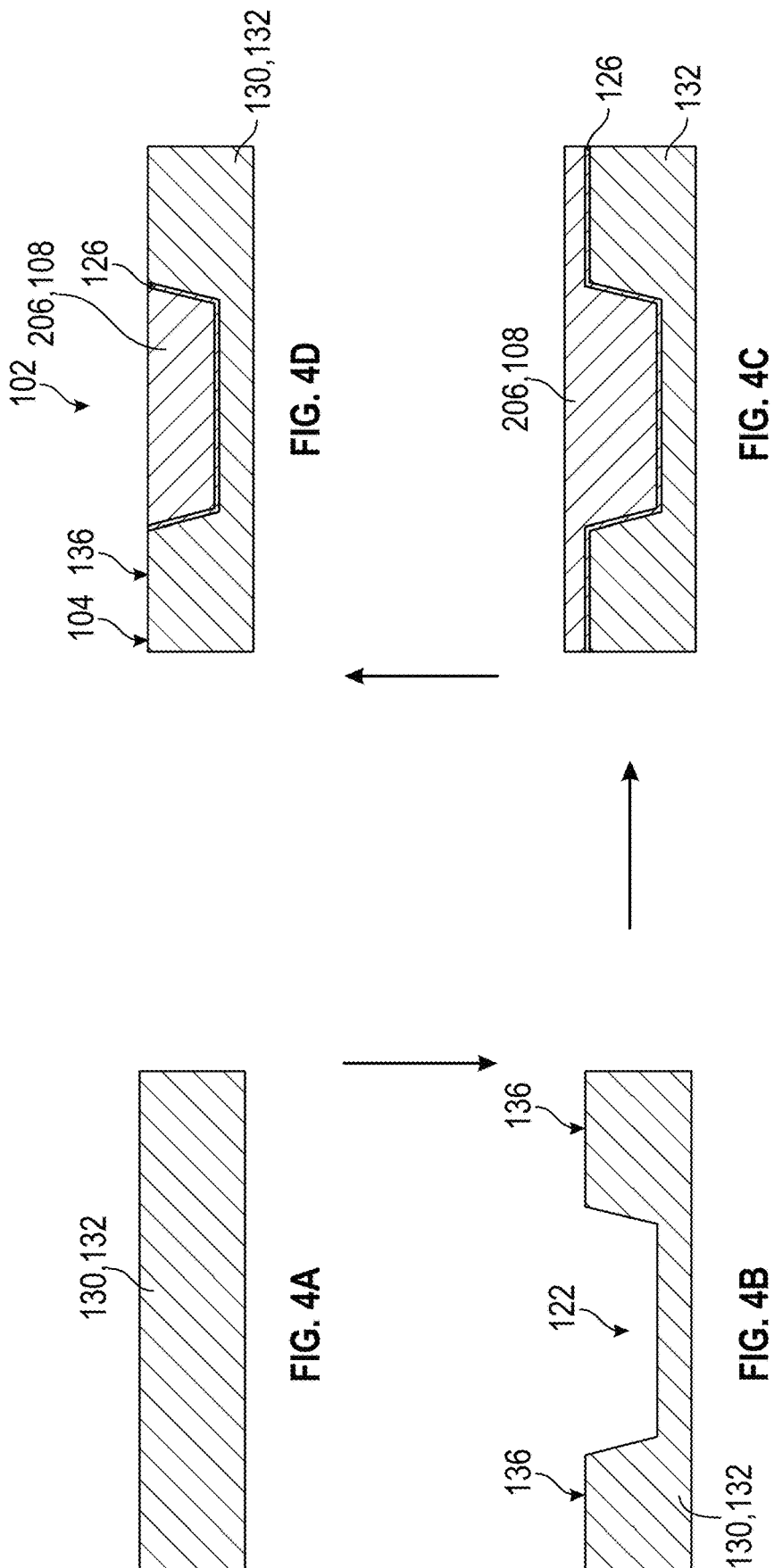
Figures 4E, 4F:
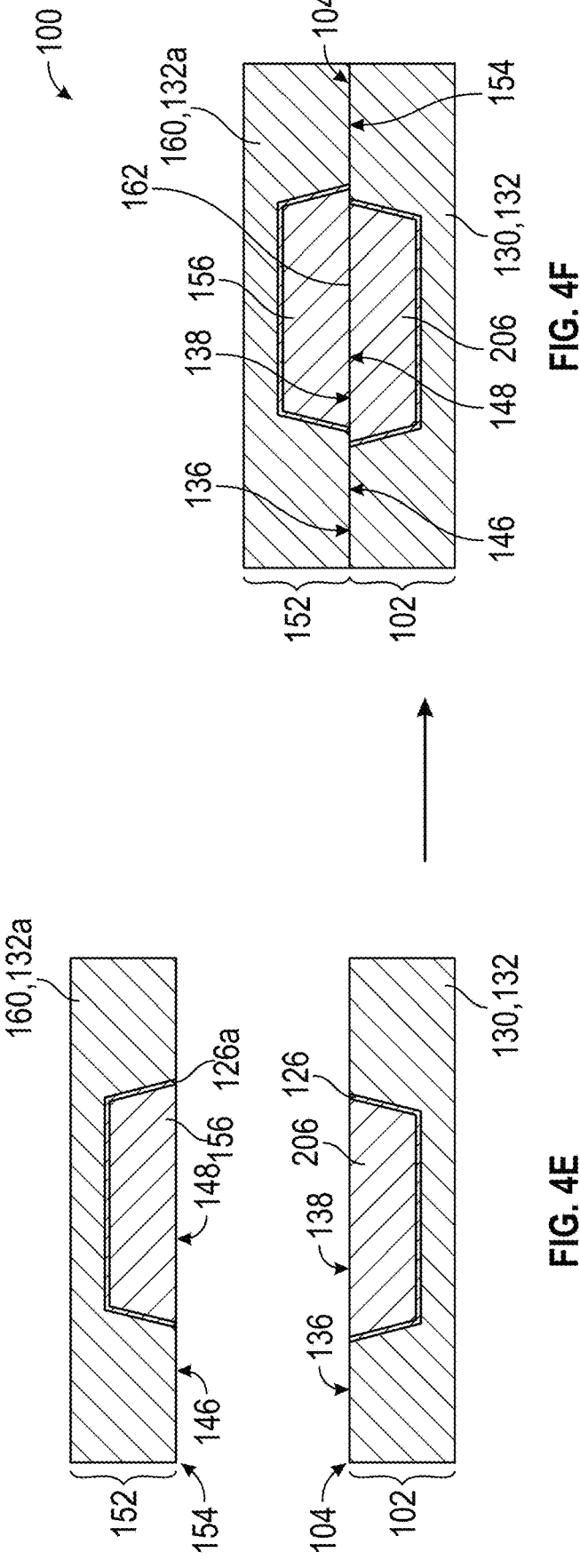

FIG. 4E is a schematic side sectional view of a first and second element prepared to be directly bonded, according to one embodiment.

FIG. 4F is a schematic side sectional view of the first and second elements from FIG. 4E after being directly bonded, according to one embodiment.

DETAILED DESCRIPTION

The present disclosure describes methods of controlling metallic grain growth of conductive features (e.g., conductive pads, through-substrate vias (TSVs), etc.) in elements, such as microelectronic elements. Various embodiments disclosed herein can be advantageous for direct metal bonding, such as direct hybrid bonding. For example, as schematically demonstrated in FIGS. 4E and 4F, two or more semiconductor elements 102, 152 (such as integrated device dies, wafers, etc.) may be stacked on or bonded to one another to form a bonded structure 100. Conductive features 206 of one element 102 may be electrically connected to corresponding conductive features 156 of another element (e.g., a second element 152). Any suitable number of elements can be stacked in the bonded structure 100. The methods and conductive feature structures described herein can be useful in other contexts as well.

In some embodiments, the elements (e.g., the first element 102 and the second element 152) are directly bonded to one another without an adhesive. In various embodiments, a non-conductive (e.g., semiconductor or inorganic dielectric) region 130 of a first element 102 can be directly bonded to a corresponding non-conductive (e.g., semiconductor or inorganic dielectric) region 160 of a second element 152 without an adhesive. Although not shown, the nonconductive layers can be provided on a bulk device, such as a semiconductor substrate having devices formed therein. In various embodiments, a conductive feature 206 (e.g., a metal pad, a contact pad, a TSV, etc.) of the first element 102 can be directly bonded to a corresponding conductive feature 156 (e.g., a metal pad, a contact pad, a TSV, etc.) of the second element 152 without an adhesive. The non-conductive region 130 can be referred to as a nonconductive bonding region or bonding layer of the first element 102. In some embodiments, the non-conductive region 130 of the first element 102 can be directly bonded to the corresponding non-conductive region 160 of the second element 152 using bonding techniques without an adhesive using the direct bonding techniques disclosed at least in U.S. Pat. Nos. 9,564,414; 9,391,143; and 10,434,749, the entire contents of each of which are incorporated by reference herein in their entirety and for all purposes. In other applications, in a bonded structure 100, a non-conductive region 130 of a first element 102 can be directly bonded to a conductive feature 156 of a second element 152, such that a conductive feature 206 of the first element 102 is intimately mated with a non-conductive region 160 of the second element 152.

In various embodiments, direct bonds can be formed without an intervening adhesive. For example, semiconductor or dielectric bonding surfaces (e.g., a nonconductive surface 136 of a first nonconductive region 130 of a first element 102 and a nonconductive surface 146 of a second nonconductive region 160 of a second element 152) can be polished to a high degree of smoothness. The bonding nonconductive surfaces can be cleaned and exposed to a plasma to activate the surfaces. In some embodiments, the bonding nonconductive surfaces can be terminated with a species after activation or during activation (e.g., during the plasma). Without being limited by theory, in some embodiments, the activation process can be performed to break chemical bonds at the bonding nonconductive surface, and the termination process can provide additional chemical species at the bonding nonconductive surface that improves the bonding energy during direct bonding. In some embodiments, the activation and termination are provided in the same step, e.g., a plasma or wet etchant to activate and terminate the nonconductive surfaces. In other embodiments, the bonding nonconductive surface can be terminated in a separate treatment to provide the additional species for direct bonding. In various embodiments, the terminating species can comprise nitrogen. Further, in some embodiments, the bonding nonconductive surfaces can be exposed to fluorine. For example, there may be one or multiple fluorine peaks near layer and/or bonding nonconductive interfaces. Thus, in the directly bonded structures, the bonding interface between two non-conductive regions 130, 160 can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact features 206 (e.g., contact pads, TSVs, etc.) of the first element 102 can also be directly bonded to corresponding conductive features 156 (e.g., contact pads, TSVs, etc.) of the second element 152. For example, a direct hybrid bonding technique can be used to provide conductor-to-conductor direct bonds along a bond interface that includes covalently direct bonded dielectric-to-dielectric surfaces (e.g., nonconductive surface 136 of a first nonconductive region 130 of a first element 102 and nonconductive surface 146 of a second nonconductive region 160 of a second element 152), prepared as described above. In various embodiments, the conductor-to-conductor (e.g., conductive feature 206 to conductive feature 156) direct bonds (e.g., bonds between a conductive surface 138 of a first conductive feature 206 of a first element 102 and a conductive surface 148 of a second conductive feature 156 of a second element 152) and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. The bonded structures 100 described herein can also be useful for direct metal bonding without non-conductive region bonding, or for other bonding techniques.

In some embodiments, inorganic dielectric bonding surfaces (e.g., nonconductive surfaces 136, 146) can be prepared and directly bonded to one another without an intervening adhesive as explained above. Conductive contact pads, such as first and second conductive features 206, 156 (which may be surrounded by nonconductive dielectric field regions, such as first and second nonconductive regions 130, 160) may also directly bond to one another without an intervening adhesive. In some embodiments, the respective conductive surfaces 138, 148 of contact pads (e.g., first and second conductive features 206, 156) can be recessed below exterior (e.g., upper) nonconductive surfaces 136, 146 of the dielectric field or nonconductive regions 130, 160, for example, recessed by less than 30 nm, less than 20 nm, less than 15 nm, or less than 10 nm, for example, recessed in a range of 2 nm to 20 nm, or in a range of 4 nm to 10 nm. The nonconductive regions 130, 160 can be directly bonded to one another without an adhesive at room temperature in some embodiments and, subsequently, the bonded structure 100 can be annealed. Upon annealing, the conductive features 206, 156 (which can be, for example contact pads, TSVs, etc.) can expand with respect to the nonconductive regions 130, 160 and contact one another to form a metal-to-metal direct bond. Beneficially, the use of hybrid bonding techniques, such as Direct Bond Interconnect, or DBI®, available commercially from Adeia of San Jose, CA, can enable high density of pads (e.g., conductive features 206, 156) connected across the direct bond interface (e.g., small or fine pitches for regular arrays). In various embodiments, the conductive features 206, 156 can comprise copper, although other metals may be suitable.

Thus, in direct bonding processes, a first element 102 can be directly bonded to a second element 152 without an intervening adhesive. In some arrangements, the first element 102 can comprise a singulated element, such as a singulated integrated device die. In other arrangements, the first element 102 can comprise a carrier or substrate (e.g., a wafer) that includes a plurality (e.g., tens, hundreds, or more) of device regions that, when singulated, form a plurality of integrated device dies. Similarly, the second element 152 can comprise a singulated element, such as a singulated integrated device die. In other arrangements, the second element 152 can comprise a carrier or substrate (e.g., a wafer).

As explained herein, the first and second elements 102, 152 can be directly bonded to one another without an adhesive, which is different from a deposition process. The first and second elements 102, 152 can accordingly comprise non-deposited elements. Further, directly bonded structures (e.g., bonded structure 100), unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride, with levels of nitrogen present at the bonding interface that are indicative of nitrogen termination of at least one of the elements prior to direct bonding. In some embodiments, nitrogen and nitrogen related moieties may not be present at the bonding interface. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads (e.g., conductive features 206, 156) can be joined such that copper grains 116 grow into each other across the bond interface. In some embodiments, the copper can have grains 116 oriented vertically along the 111 crystal plane for improved copper diffusion across the bond interface. In some embodiments, the misorientation of 111 crystal planes in the conductive material may be in a range of ±300 with respect to the vertical direction from the conductive surface of the conductive material (e.g., the conductive surfaces 138, 148 of the conductive features 206, 156 of the first and second elements 102, 152). In some embodiments, the crystal misorientation can be in a range of ±20°, or in a range of ±15°, with respect to the vertical direction. The bond interface can extend substantially entirely to at least a portion of the bonded contact pads (e.g., conductive features 206, 156), such that there is substantially no gap between the nonconductive bonding regions (e.g., the nonconductive regions 130, 160) at or near the bonded contact pads (e.g., the conductive features 206, 156). In some embodiments, a barrier layer may be provided under the conductive features 206, 156 (e.g., which may include copper or copper alloy). In other embodiments, however, there may be no barrier layer under the conductive features 206, 156, for example, as described in US 2019/0096741, which is incorporated by reference herein in its entirety and for all purposes.

Annealing temperatures (also referred to herein as "bonding temperature") and annealing durations for forming the metal-to-metal direct bond (e.g., the direct bond between the conductive surface 138 of the first conductive feature 206 of the first element 102 and the conductive surface 148 of the second conductive feature 156 of the second element 152) can affect the consumption of thermal budget by the annealing. Bonding temperatures can, for example, be in a range of 100° C. to 250° C., 100° C. to 200° C., 150° C. to 200° C., or 100° C. to 150° C. It may be desirable to lower the annealing temperature and/or annealing duration to minimize consumption of the thermal (energy) budget. Surface diffusion of atoms along the 111 crystal plane (<111>) can be 3 to 4 orders of magnitude faster than along the 100 or 110 crystal planes. Also, a metal (e.g., Cu) with grains oriented along a 111 crystal plane can have a higher surface mobility as compared to conventional back end of line (BEOL) copper. Further, low-temperature direct metal-to-metal bonding (which can include bonding that occurs when a bonding temperature is at or below 250° C.) is enabled by creep on the 111 crystal plane of Cu of the nano-texture surface. Therefore, it can be advantageous to have the 111 crystal plane on the bonding surface (e.g., contact surfaces 104, 154) in order to shorten the annealing time and/or reduce the annealing temperature for direct bonding (e.g., direct hybrid bonding). In some embodiments, the advantage to have the 111 crystal plane can be pronounced especially at lower temperatures because the metal surface diffusion (e.g., Cu surface diffusion) also slows down when the annealing temperature is reduced. Accordingly, in various embodiments disclosed herein, a crystal structure can have grains oriented vertically along the 111 crystal plane to enhance metal diffusion (e.g., copper diffusion) during direct bonding.

A metal layer can be formed with a process selected to plate a copper (Cu) layer having Cu in the 111 crystal orientation. The Cu layer may be deposited from a non-superfilling or super-filling electroplating bath, for example, with plating chemistry selected to optimize efficient filling of voids (e.g., vias, trenches) in the substrate, rather than to optimize the direct metal-to-metal bonding to occur during direct hybrid bonding. Subsequent metal treatment, described herein below, can facilitate subsequent bonding such that any desirable plating chemistry can be employed to optimize for other considerations, such as filling noted above. The microstructure (e.g., a grain size) of the deposited or coated metal layer (e.g., the conductive elements 206, 156) may be stabilized before the metal planarization process (e.g., chemical mechanical polishing, or CMP). The microstructure of the metal layer (e.g., the conductive elements 206, 156) can be stabilized for example by an annealing step, separate from the annealing step of the direct hybrid bonding that occurs later. In some embodiments, the plated metal can be partially stabilized before the CMP operation to form the bonding surface (e.g., contact surfaces 104, 154). In some other embodiments, the plated metal may be completely stabilized before the CMP operation.

As described above, the contact pads (e.g., conductive features 206, 156) can expand with respect to the nonconductive bonding regions (e.g., nonconductive regions 130 and 160) and contact one another to form a metal-to-metal direct bond (e.g., a bond between contact surfaces 104, 154). For example, the expansion of the contact pads (e.g., conductive features 206, 156) can be caused primarily by thermal expansion of a material (e.g., copper) of the contact pads relative to the nonconductive bonding regions (e.g., nonconductive regions 130 and 160). Grain growth of the contact pads (e.g., conductive features 206, 156) can at least partially cause the contact pads to expand. It can be beneficial for the grain growth to occur when the contact pads (e.g., conductive features 206, 156) are annealed to expand the contact pads when bonding the contact pads to one another, for example by bonding contact surfaces 104, 154. However, the grain growth of the contact pads (e.g., conductive features 206, 156) can occur prior to bonding or annealing. For example, in a material such as copper, diffusion between grains 116 of copper can cause grain growth at a room temperature. If grains 116 grow at room temperature, then a higher anneal temperature might be required to induce further grain growth than would have otherwise been required had the grains 116 not grown at room temperature. This is because grown grains can be in a more stable state. Grain growth and/or expansion of the contact pads (e.g., conductive features 206, 156) can be temperature driven. For a reliable bonding between the contact pads (e.g., conductive features 206, 156), it can be beneficial to minimize the grain growth prior to bonding or annealing to preserve potential energy of the material of the contact pads until the bonding or annealing in order for the material to sufficiently expand when bonding or annealing. Said differently, direct hybrid bonding can be performed by causing contact pads (e.g., conductive features 206, 156) to expand during an anneal, and this expansion can be driven in part by grain growth. One way to complete this anneal in a way that can reduce impacts on a thermal budget can be to reduce or minimize the grain growth (and corresponding release of potential energy) that would occur at room temperature. Such a reduction of grain growth at room temperature maintains the potential energy of the conductive material 108 until the anneal at a bonding temperature. In such a configuration, the potential energy released from grain growth can contribute to driving the direct bonding between the contact pads (e.g., conductive features 206, 156) during the anneal, instead of being released and lost in ambient conditions before the anneal.

The above phenomena can be described at least in part by the following equations.

$$D = \frac{2Mk_BT}{A}$$

Force on grain boundary imposed by pinning drag.
$$f_r = -\frac{1}{A}\frac{\partial \Delta E}{\partial \hbar} = -k_s\hbar$$

Modified diffusion equation to accommodate drag.
$$\langle\hbar^2(t)\rangle = \frac{k_BT}{Ak_s}\left(1 - e^{-2Mk_st}\right)$$
$$= \begin{cases} \frac{2Mk_BT}{A}t & \text{if } t \ll \frac{1}{Mk_s} \\ \frac{k_BT}{Ak_s} & \text{if } t \gg \frac{1}{Mk_s} \end{cases}$$

$\langle\hbar^2(t)\rangle = \frac{k_BT}{Ak_s}$ Limit for sufficiently long times.

wherein M is grain boundary mobility; $k_S$ is drag coefficient from pinning; $k_B$ is Boltzmann constant; A is grain boundary area; D is diffusion coefficient; $f_r$ is drag force; T is temperature; t is time; $\Delta E$ is interaction energy required to overcome drag; and h-bar is grain boundary displacement.

Various embodiments disclosed herein relate to forming an element (e.g., element 102) with a conductive pad (e.g., conductive feature 206) that has a direct bonding surface (e.g., contact surface 104) having impurities 120 at a grain boundary 118 of a conductive material 108 (e.g., copper) of the conductive pad (e.g., conductive feature 206) to prevent or minimize grain growth of the conductive material 108 (e.g., copper) before bonding or annealing. The impurities 120 can be disposed at grain boundaries 118 within the conductive material 108 (e.g., copper) of the contact pads (e.g., conductive feature 206).

FIGS. 1A-1C illustrate the morphology evolution of the microstructure of a contact surface of a conductive feature 106 of an element (e.g., a semiconductor element), when there is a relatively low or minimum level of impurities 120 at grain boundaries 118 soon after plating. FIGS. 1A-1C illustrates how the microstructure of the contact surface can evolve as the conductive feature 106 is processed during a direct hybrid bonding procedure. FIG. 1A illustrates the microstructure (e.g., grain 116 sizes and shapes) of the contact surface of the conductive feature 106 soon after plating. FIG. 1B illustrates the microstructure of the same contact surface of the conductive feature 106, but just before an annealing process after undergoing partial room temperature grain growth. And FIG. 1C illustrates the microstructure of the same contact surface of the conductive feature 106 after an annealing process at a bonding temperature. The bonding temperature can, for example, be in a range of 100° C. to 250° C., 100° C. to 200° C., 150° C. to 200° C., or 100° C. to 150° C. Difference(s) in microstructure between FIGS. 1A and 1B is understood to be at least partially the result of the conductive feature 106 being exposed to ambient conditions (e.g., at room temperature) between plating and the anneal. Difference(s) in microstructure between FIGS. 1B and 1C is understood to be at least partially the result of the conductive feature 106 being annealed at a bonding temperature.

In FIGS. 1A-1C, the conductive feature 106 can comprise a conductive material 108 and a non-alloying material 110. The non-alloying material 110 does not form an alloy with the conductive material 108 at the bonding temperature. The conductive material 108 can comprise copper or gold or silver or their respective alloys. The conductive material 108 can form grains 116. Grain boundaries 118 can form at the interfaces between grains 116 of conductive material 108. The non-alloying material 110 can, for example, comprise a metallic compound, a metal oxide, a non-metallic compound, a non-metal oxide, a chemical compound, and/or a refractory material—as described further herein. The non-alloying material 110 can form impurities 120 within the conductive material 108 of the conductive feature 106. Each impurity 120 can diffuse or migrate throughout the conductive material 108 and can be within a grain 116 or along a grain boundary 118 or accumulate around the grain boundaries 118. When a sufficient amount of impurities 120 accumulate along grain boundaries 118, the impurities 120 can "pin" the grains 116 and suppress grain growth. An additional amount of energy can be introduced to induce pinned grains 116 to grow. This may include, for example, annealing and exposing the microstructure of the grains 116 with accumulated impurities 120 to higher temperatures for an adequate length of time. The higher temperatures increase the mobility of the atoms within the grain 116 and especially along the grain boundaries 118. The increased mobility of the grain boundaries 118 leads to grain growth and increase in the size of the grains 116. The word "pin" does not mean that the pinned grain boundaries 118 are completely immobile; rather, the impurity 120 may exert a force (e.g., a drag or pinning force) that can reduce the grain boundary's 118 mobility, thereby slowing grain growth. In short, more impurities 120 along grain boundaries 118 increases pinning, which can decrease grain growth.

In FIGS. 1A-1C, the conductive feature 106 includes a minimum level of impurities 120, which means the grains 116 of conductive material 108 are minimally pinned. FIG. 1A illustrates the very fine grains 116 of conductive material 108 that can result immediately after plating. FIG. 1A also illustrates a minimal amount of impurities 120 within the conductive material 108. In part because of the minimal level of impurities 120, the grains 116 within the conductive feature 106 are not pinned and can grow even in ambient conditions (e.g., at room temperature) before annealing, as shown in FIG. 1B. This grain growth that can occur in ambient conditions can be referred to as a "natural anneal," which is different from an anneal at a bonding temperature. FIG. 1C illustrates that the grains 116 within the conductive feature 106 can continue to grow during an anneal at a bonding temperature.

FIGS. 2A-2C show the morphology evolution of the microstructure of a contact surface 104 (shown in FIG. 4D) of a conductive feature 206 within an element 102 (shown in FIG. 4D), according to various embodiments, when there is a level of impurities 120 at grain boundaries 118 selected to manage grain growth, soon after plating. The amount of impurities 120 at the grain boundaries 118 shown in FIG. 2A is higher than that shown in FIG. 1A. FIGS. 2A-2C show how the microstructure of the contact surface 104 (shown in FIG. 4D) can evolve as the conductive feature 206 is processed, according to various embodiments. FIG. 2A shows the microstructure (e.g., grain 116 sizes and shapes)

of the contact surface 104 (shown in FIG. 4D) of the conductive feature 206 soon after plating, according to various embodiments. FIG. 2B shows the microstructure of the same contact surface 104 (shown in FIG. 4D), but just before an anneal, according to various embodiments. And FIG. 2C shows the microstructure of the same contact surface 104 (shown in FIG. 4D) after an anneal at a bonding temperature, according to various embodiments. The bonding temperature can, for example, be in a range of 100° C. to 350° C., 100° C. to 250° C., 100° C. to 200° C., 150° C. to 200° C., or 100° C. to 150° C. Difference(s) in microstructure between FIGS. 2A and 2B is understood to be at least partially the result of the conductive feature 206 being exposed to ambient conditions (e.g., at room temperature) between plating and the anneal. Difference(s) in microstructure between FIGS. 2B and 2C is understood to be at least partially the result of the conductive feature 206 being annealed at a bonding temperature.

In FIGS. 2A-2C, the conductive feature 206 can comprise a conductive material 108 and a non-alloying material 110, according to various embodiments. The non-alloying material 110 does not form an alloy with the conductive material 108 at the bonding temperature. The conductive material 108 can comprise copper or gold or silver or their alloys, according to various embodiments. The conductive material 108 can form grains 116. Grain boundaries 118 can form at the interfaces between grains 116 of conductive material 108. The non-alloying material 110 can, for example, comprise a metallic compound, a metal oxide, a non-metallic compound, a non-metal oxide, a chemical compound, and/or a refractory material, according to various embodiments—as described further herein. The non-alloying material 110 can form impurities 120 within the conductive material 108 of the conductive feature 206. Each impurity 120 may diffuse or migrate throughout the conductive material 108 and typically accumulate along a grain boundary 118. When a sufficient amount of impurities 120 accumulate along grain boundaries 118 or around the grains 116, the impurities 120 can "pin" the grains 116 and suppress the growth of the various grains 116. An additional amount of energy can be introduced to induce pinned grains 116 to grow. One example method for unpinning the grains 116 can include exposing the pinned microstructure to higher temperatures for adequate length of times. The higher temperature increases the mobility of the atoms within the grain 116 and especially along the grain boundaries 118. The increased mobility of the grain boundaries 118 can unpin the pinned grains, thus leading to grain growth and increase in the size of the grains 116. In short, more impurities 120 along grain boundaries 118 increases pinning, which can decrease grain growth.

In FIGS. 2A-2C, the conductive feature 206 includes a first level of impurities 120 selected to manage grain growth, which means the grains 116 of conductive material 108 can be selectively pinned, according to various embodiments. FIG. 2A shows the very fine grains 116 of conductive material 108 that can result immediately after plating. FIG. 2A also illustrates an amount of impurities 120 within the conductive material 108 selected to manage grain growth. The amount of the impurities can be selected to pin the grains 116 from growing before bonding and annealing (in, e.g., ambient conditions) as shown in FIG. 2B, but allow grain growth during an anneal at a bonding temperature (e.g., between 100° C. and 250° C.), as shown in FIG. 2C. In part because of the level of impurities 120 selected to manage grain growth, the grains 116 within the conductive feature 206 are pinned sufficiently to prevent or minimize grain growth in ambient conditions (e.g., at room temperature) before annealing, as shown in FIG. 2B. The presence of an amount of impurities 120 selected to manage grain growth can prevent or minimize a "natural anneal." FIG. 2C illustrates that the grains 116 within the conductive feature 206 can grow during an anneal at a bonding temperature.

An amount of impurities 120 along grain boundaries 118 selected to manage grain growth can strike a balance: there can be enough impurities 120 along grain boundaries 118 to cause enough pinning to reduce or minimize grain growth in ambient conditions (e.g., at room temperature), but not so many impurities 120 along grain boundaries 118 as to prevent or minimize grain growth at a bonding temperature, which can, for example, be in a range of 100° C. to 250° C., 100° C. to 200° C., 150° C. to 200° C., or 100° C. to 150° C. As described herein, such an amount of impurities 120 selected to manage grain growth can facilitate direct hybrid bonding by maintaining the potential energy of the conductive material 108 in ambient conditions, then permitting the grain growth that can help form a reliable direct bond between two conductive features 206, 156 of two elements 102, 152 (shown in FIG. 4F) at a bonding temperature (e.g., in a range of 100° C. to 250° C., 100° C. to 200° C., 150° C. to 200° C., or 100° C. to 150° C.).

FIGS. 3A-3C show the morphology evolution of the microstructure of a contact surface 104 (shown in FIG. 4D) of a conductive feature 306 within an element 102 (shown in FIG. 4D), according to various other embodiments, when there is a high level of impurities 120 at grain boundaries 118 soon after plating. The amount of impurities 120 at the grain boundaries 118 shown in FIG. 3A is higher than that shown in FIG. 2A. FIGS. 3A-3C show how the microstructure of the contact surface 104 (shown in FIG. 4D) can evolve as the conductive feature 306 is processed, according to various embodiments. FIG. 3A shows the microstructure (e.g., grain 116 sizes and shapes) of the contact surface 104 (shown in FIG. 4D) of the conductive feature 306 soon after plating, according to various embodiments. FIG. 3B shows the microstructure of the same contact surface 104 (shown in FIG. 4D) of the conductive feature 306, but just before an anneal, according to various embodiments. And FIG. 3C shows the microstructure of the same contact surface 104 (shown in FIG. 4D) of the conductive feature 306 after an anneal at a bonding temperature, according to various embodiments. The bonding temperature can, for example, be in a range of 100° C. to 400° C., 100° C. to 250° C., 100° C. to 200° C., 150° C. to 200° C., or 100° C. to 150° C. Difference(s) in microstructure between FIGS. 3A and 3B is understood to be at least partially the result of the conductive feature 306 being exposed to ambient conditions (e.g., at room temperature) between plating and the anneal. Difference(s) in microstructure between FIGS. 3B and 3C is understood to be at least partially the result of the conductive feature 306 being annealed at a bonding temperature.

In FIGS. 3A-3C, the conductive feature 306 can comprise a conductive material 108 and a non-alloying material 110, according to various embodiments. The non-alloying material 110 does not form an alloy with the conductive material 108 at the bonding temperature. The conductive material 108 can comprise copper or gold or silver or their alloys, according to various embodiments. The conductive material 108 can form grains 116. Grain boundaries 118 can form at the interfaces between grains 116 of conductive material 108. The non-alloying material 110 can, for example, comprise a material not soluble in the conductive material 108 at the bonding temperature and may comprise a metallic material, a metallic compound, a metal oxide, a non-metallic compound, a non-metal oxide, a chemical compound, and/or a refractory material, according to various embodiments—as described further herein. The non-alloying material 110 can form impurities 120 within the conductive material 108 of the conductive feature 306. Each impurity 120 can diffuse or migrate throughout the conductive material 108 and can be within a grain 116 or along a grain boundary 118. When a sufficient amount of impurities 120 are along grain boundaries 118, the impurities 120 can "pin" the grains 116, which can reduce grain growth. In short, more impurities 120 along grain boundaries 118 increases pinning, which tends to decrease grain growth. In some embodiments, the non-alloying material 110 may comprise a material having limited solubility in the conductive material 108 at the bonding temperature. For example, the solubility of the non-alloying material 110 can be less than 20% in the conductive material 108 at the bonding temperature; and less than 5% or less than 1% or less than 0.05% at room temperature.

In FIGS. 3A-3C, the conductive feature 306 includes a second, high level of impurities 120, which means the grains 116 of conductive material 108 can be substantially fully pinned. FIG. 3A shows the very fine grains 116 of conductive material 108 that can result immediately after plating. FIG. 3A also illustrates a relatively high amount of impurities 120 within the conductive material 108. The amount of impurities 120 can be selected to be high enough to cause enough pinning to prevent or minimize grain growth within the conductive feature 306, both in ambient conditions before bonding and annealing (e.g., at room temperature) as shown in FIG. 3B, and also during an anneal at a bonding temperature (e.g., in a range of 100° C. to 400° C., 100° C. to 250° C., 100° C. to 200° C., 150° C. to 200° C., or 100° C. to 150° C.), as shown in FIG. 3C. The presence of a high level of impurities 120 in conductive feature 306 can reduce or minimize both a "natural anneal" and an anneal at a bonding temperature. In short, FIG. 3B shows that the sizes of grains 116 can remain similar to those shown in FIG. 3A at room temperature, and FIG. 3C shows that the sizes of grains 116 can remain similar to those shown in FIGS. 3A and 3B, even after an anneal at a bonding temperature. Therefore, when no grain growth is wanted, the high impurity content sufficiently high to prevent grain growth can be introduced.

The impurities 120 used in FIGS. 1A-3C can comprise non-alloying impurities 120 that do not form alloys with the conductive material 108 (e.g., copper) of the conductive feature 206. The non-alloying impurities 120 can comprise a material that is insoluble with the conductive material 108 (e.g., copper) of the conductive feature 206 at the annealing temperatures of interest (e.g., at a bonding temperature). In some embodiments that utilize copper as the conductive material 108 for the conductive feature 206, the non-alloying impurities 120 can comprise a metallic compound. In some embodiments, the non-alloying impurities 120 can comprise a metal oxide. In some embodiments, the non-alloying impurities 120 can comprise a non-metallic compound. In some embodiments, the non-alloying impurities 120 can comprise a non-metal oxide. In some embodiments, the non-alloying impurities 120 can comprise other compounds, i.e., two or more bonded chemical elements, such as ceramic materials. In some embodiments, the non-alloying impurities 120 can comprise a refractory material. A non-exhaustive list of such materials includes aluminum nitride, tantalum particles and nanoparticles, tantalum nitride particles and nanoparticles, titanium nitride particles and nanoparticles, aluminum oxide, nickel oxide particles and nanoparticles, magnesium oxide particles and nanoparticles, manganese oxide particles and nanoparticles, glass, ceramic or glass-ceramic particles and nanoparticles, silicon carbide (SiC), silicon nitride (SiN), silicon carbide-nitride (SiCN), silicon oxide, tantalum (Ta), zirconium (Zr), molybdenum (Mo), and tungsten (W).

In some embodiments, the impurities 120 can be introduced by co-deposition sputtering of the impurities 120 and the conductive material 108 into cavity 122 of FIG. 4B to form the structures of FIG. 4C. In some embodiments, a sputtering target comprising the impurities 120 and the conductive material 108 may be sputtered into cavity 122 to form the structure of FIG. 4C. In some embodiments, the impurities 120 may be introduced as a particulate material into an electroplating bath and is co-deposited into the conductive material 108 during the plating step to form the conductive material 108 in FIG. 4C. In some embodiments, the impurities 120 can comprise silicon oxide (or other non-metal oxide) particles or silicon carbide (or other non-metallic compounds). In some embodiments, the non-alloying material can be introduced into the conductive material 108 of the conductive feature 206 as very fine particles (e.g., particles with a linear lateral dimension of less than 200 nm, less than 100 nm, less than 50 nm, or less than 20 nm) of the non-alloying impurities 120 into the electroplating bath, and the impurities 120 may be co-deposited with the conductive material 108 on the substrate of interest, for example, by galvanostatic or potentiostatic methods, by pulse plating or by the various combinations thereof.

In the conductive feature 106 shown in FIGS. 1A-1C, there can be less than 20 parts per million (ppm) of impurities 120, such as 2 ppm or 3 ppm of impurities 120. For example, the conductive feature 106 of FIG. 1A can include 2 ppm to 20 ppm, 5 ppm to 20 ppm, 2 ppm to 15 ppm, or 5 ppm to 15 ppm of impurities 120. In such a conductive feature 106, grains 116 of a conductive material 108 of the conductive feature 106 can grow at room temperature. The grown grains 116 shown in FIG. 1B—having lower potential energy relative to the fine grains 116 shown in FIG. 1A—can be in a relatively stable state such that a relatively high bonding temperature may be needed for the intimate mating of multiple conductive features 106 of multiple elements being directly bonded to one another. In some applications, a relatively low direct bonding or annealing temperature (low thermal budgets) may be preferred because of some limitation or constraint imposed by one of the elements 102, 152 being bonded (shown in FIG. 4F). One example of a limitation that lowers a bonded structure's thermal budget is when a relatively higher annealing temperature (for example higher than 250° C.) is used for bonding two elements with a relatively large difference in the coefficient of thermal expansion (CTE). Such a thermal expansion mismatch between the two elements may cause defects, stress-related cracks in the bonded structure, or device degradation. In some embodiments, the CTE difference between materials in the first and second elements 102, 152 can be greater than 2 ppm/° C. or 5 ppm/° C. and in other applications can be greater than 10 ppm/° C. The use of conductive features 206 with impurity amounts selected to manage grain growth (as shown, e.g., in FIGS. 2A-2C) can facilitate the use of elements (e.g. first and second elements 102, 152) with CTE differences that can be greater than 2 ppm/° C., 5 ppm/° C., or 10 ppm/° C., which, as described above, are elements that are typically susceptible to thermal-related damage. This can be because the use of such conductive features 206 can reduce the thermal impact of a bonding process by, for example, reducing the bonding temperature, a bonding time, or both, of the anneal. In some embodiments, a smaller die may be bonded to a larger die, hence a bonded surface area (not shown) of the first element 102 may be smaller than a bonded surface area (not shown) of the second element 152.

In the conductive feature 206 of FIGS. 2A-2C, the first amount of impurities 120 can be a sufficient amount of impurities 120 that can delay grain growth of the conductive material 108 of the conductive feature 206 such that a stored potential energy of the conductive material 108 due, for example, to relatively small grains 116 with relatively high atomic vacancies is maintained until the annealing process for bonding the conductive feature 206 to another conductive feature (e.g., the conductive feature 156 of the second element 152, shown in FIG. 4E). The delay of the grain growth can be due to an increase in drag coefficient ($k_s$ in the equations above). In some embodiments, the first amount of impurities 120 can enable the conductive material 108 of the conductive feature 206 to prevent or minimize grain growth at room temperature.

In the conductive feature 306 of FIGS. 3A-3C, the second amount of impurities 120 can be a sufficient amount of impurities 120 that can delay grain growth of the conductive material 108 of the conductive feature 306 such that the stored potential energy of the conductive material 108 is maintained until the annealing process for bonding the conductive feature 306 to another conductive feature (e.g., the conductive feature 156 of the second element 152, shown in FIG. 4E). The second amount (i.e., the amount of impurities 120 in FIGS. 3A-3C) of impurities 120 is greater than the first amount (i.e., the amount of impurities 120 in FIGS. 2A-2C). In some embodiments, the conductive material 108 with the second amount of impurities 120 can delay grain growth of the conductive material 108 for a longer time than can the conductive material 108 with the first amount of impurities 120. In some embodiments, the second amount of impurities 120 can enable the conductive material 108 of the conductive feature 306 to prevent or minimize grain growth at room temperature.

The conductive features (e.g., the first conductive feature 206 of the first element 102 and the second conductive feature 156 of the second element 152) disclosed herein can be replaced with any suitable conductive feature or structure. A conductive feature 206 can comprise a contact pad configured to directly bond to another conductive feature 156 on an opposing element. The conductive feature 206 can comprise a contact pad connected to underlying circuitry or traces, a through-substrate via (TSV) extending at least partially through a substrate, or any other conductive material configured to directly bond and contact an opposing conductive feature 156.

FIGS. 4A-4F show schematic cross sectional side views illustrating various steps in a process of manufacturing a first element 102 then a bonded structure 100. In FIG. 4A, a nonconductive region 130 can be provided. The nonconductive region 130 can comprise a nonconductive material (e.g., dielectric material 132), such as silicon oxide, silicon nitride, silicon oxynitride, or other similar materials. In FIG. 4B, an opening 122 can be formed at a nonconductive surface 136 of the nonconductive region 130. The opening 122 may comprise any suitable shape and size for receiving a conductive material 108 (shown in FIG. 4C), so as to form a conductive feature 206 (shown in FIG. 4D), such as a contact pad or a via, such as a through-substrate via (TSV) or a through-substrate groove (TSG). The nonconductive surface 136 can comprise a contact surface that in some embodiments can bond to the nonconductive surface 148 of a second element 152, as shown in FIGS. 4E and 4F.

In FIG. 4C, a barrier layer 126, a seed layer (not shown), and a conductive material 108 can be provided in the opening 122 and over the surface of the dielectric material 132. The barrier layer 126 can comprise a nitride, such as titanium nitride (TiN) or tantalum nitride (TaN). And the seed layer (not shown) can be a metallic (e.g. copper) seed that can be deposited over the barrier layer 126 and used as a seed for the electroplating process that fills the opening 122 with the conductive material 108. In FIG. 4C, impurities 120 (not shown) can be provided in the conductive material 108 of the conductive feature 206. In some embodiments, the impurities 120 (not shown) can be provided as a seed layer (not shown), e.g., can be sputtered into the opening 122. In some other embodiments, the impurities 120 can be provided by way of a physical vapor deposition (PVD) process or sputtering. For example, the impurities 120 can be provided by way of co-deposition of impurities 120 at a certain concentration with the conductive material 108 using a doped conductive material target or co-sputtering, or co-plating the impurities 120 with the conductive materials 108 from electroless or electrolytic plating bath or baths. More than one type of plating bath may be applied to fill the opening 122 in the dielectric material 132. After the seed layer coating step, a first bath that comprises a superfilling can be used to form a conductive material 108 (e.g., a void free or generally void free conductive material) in bulk of the opening 122. For example, with the first bath, the opening 122 can be filled less than 90% of the depth of the opening 122 (not shown). A second coating process may be applied to fill and overfill the opening 122 in the dielectric material 132. The second coating can include grain size modulated particles. In some embodiments, the impurities 120 (not shown) can comprise nanoparticles. In some embodiments, the impurities 120 can be provided by way of atomic layer deposition (ALD) method. An amount of the impurities 120 can be selected so as to maintain the stored potential energy of the conductive material 108 in ambient conditions (e.g., at room temperature) before an annealing process. The conductive feature 206 is configured such that grains 116 (not shown) of the conductive material 108 grow slower than the conductive material 108 without the impurities 120 (not shown) at room temperature.

In FIG. 4D, an element 102 can be formed. In FIG. 4D at least a portion of the conductive material 108 can be removed. The portion of the conductive material 108 can be removed by way of chemical mechanical polishing (CMP). In some embodiments, the CMP process can also remove a very small portion of the nonconductive surface 136 of the dielectric material 132 to form the contact surface 104. When the nonconductive surface 136 of the dielectric material 132 is polished, there can be dielectric rounding at a region of the contact surface 104 adjacent to the barrier layer 126 or conductive material 108 in the opening 122 (shown in FIG. 4B) of the dielectric material 132. The presence of impurities 120 (not shown) can reduce the grain 116 size (not shown) of the conductive material 108 within the conductive feature 206 in the opening 122. Smaller grains tend to be mechanically harder than larger grains, thus the presence of the impurities in the conductive material 108 can reduce the polish rate for polishing the conductive material 108. The reduced polish rate of the small grain conductive material 108 can coincidentally minimize the dielectric rounding. Although not shown in FIGS. 4A-4D, it should be appreciated that the illustrated dielectric material 132 (e.g., a nonconductive region 130) and conductive feature 206 (which can comprise a conductive material 108 with embedded impurities 120 (not shown)) may be formed on a larger semiconductor device region (not shown) such as a silicon region or layer. Each element 102 can comprise a plurality of conductive features 206 formed in the contact surface 104.

FIG. 4E shows the element 102 (a first element 102) and another element (a second element 152) before being bonded together to form a bonded structure 100 (shown in FIG. 4F). In some embodiments, the second element 152 can have a similar structure as the first element 102. In some embodiments, each of the first and second elements 102, 152 can include a conductive feature 206, 156 at least partially embedded in a nonconductive region 130, 160, as described above. The conductive features 206, 156 can comprise a conductive material 108 (shown, e.g., in FIGS. 2A-2C) and impurities 120 (shown, e.g., in FIGS. 2A-2C), as described above. The conductive material 108 includes grains 116 (shown, e.g., in FIGS. 2A-2C) and grain boundaries 118 (shown, e.g., in FIGS. 2A-2C), and impurities 120 (shown, e.g., in FIGS. 2A-2C) can be embedded in grains 116 or along grain boundaries 118 within the conductive features 206, 156. In some embodiments, each of the elements 102 and 152 can include a seed layer (not shown) and/or a barrier layer 126, 126a disposed between each element's conductive feature 206, 156 and dielectric material 132, 132a.

The bonded structure 100 (shown in FIG. 4F) can be formed by bonding the first element's 102 contact surface 104 to the second element's 156 contact surface 154. Each element's 102, 152 contact surface 104, 154 can comprise a nonconductive portion (e.g., a nonconductive surface 136, 146, which can be the surface of the nonconductive region 130, 160) and a conductive portion (e.g., a conductive surface 138, 148, which can be the surface of the conductive feature 206, 156). The conductive surfaces 138, 148 can be recessed below the nonconductive surfaces 136, 146 by, for example, less than 30 nm. These recesses are not shown in the figures.

FIG. 4F shows a bonded structure 100 in which the first and second elements 102, 152 shown in FIG. 4E are directly bonded to each other along the contact surfaces 104, 154. During the direct bonding process, the elements 102, 152 (shown in FIG. 4F) can be brought together to form a direct bond between adjacent nonconductive regions 130, 160 and annealed to impart expansion to the conductive features 206, 156 to form electrical contacts between opposing conductive features 206, 156. Beneficially, the potential energy of the conductive material (e.g., copper) of the conductive features 206, 156 can be maintained prior to bonding by providing non-alloying impurities 120 (shown, e.g., in FIGS. 2A-2C) that migrate to the grain boundaries 118 of the conductive material. Maintaining the potential energy can beneficially lower the thermal budget of the direct bonding process by reducing the temperature at which the elements 102, 152 are annealed in order to form the metallic contacts between opposing conductive features 206, 156.

The nonconductive (e.g., dielectric) material 132 of the nonconductive region 130 of the first element 102 can be bonded to the nonconductive (e.g., dielectric) material 132a of the nonconductive region 160 of the second element 152. The dielectric material 132 of the first element 102 can be directly bonded to the dielectric material 132a of the second element 152 without an intervening adhesive. Once the nonconductive surface 136 of the first element 102 is directly bonded to the nonconductive surface 146 of the second element 152, in some embodiments, the first and second conductive features 206, 156 can still have some separation between them because each of the conductive surfaces 138, 148 can be recessed below the contact surfaces

104, 154. After the nonconductive regions 130, 160 of the first and second elements 102, 152 are bonded to one another, the bonded elements 102, 152 can be annealed to form the bonded structure 100. During the anneal, the conductive features 206, 156 can expand and directly bond to each other. The first and second conductive features 206, 156—once being directly bonded to each other—can form a single component: bonded conductive features 162.

In some embodiments, the bonded elements 102, 152 can be annealed at a relatively low temperature. For example, the bonded elements can be annealed at a bonding temperature below 250° C., or at a temperature in a range of 100° C. to 250° C., 100° C. to 200° C., 150° C. to 200° C., or 100° C. to 150° C. The impurities 120 (shown, e.g., in FIGS. 2A-2C) can comprise a non-alloying material that does not form an alloy with the conductive material 108 at the bonding temperature, as described herein.

In some embodiments, the impurities 120 (shown, e.g., in FIGS. 2A-2C) can be provided to cover, for example, 5% to 75%, 5% to 40%, 5% to 30%, 15% to 75%, 15% to 40%, or 15% to 30% of grain boundaries 118 (shown, e.g., in FIGS. 2A-2C) of the conductive material 108 (shown, e.g., in FIGS. 2A-2C). In some embodiments, the conductive feature 206 can include, for example, 20 parts per million (ppm) to 5000 ppm, 20 ppm to 1000 ppm, 50 ppm to 1000 ppm, 100 ppm to 5000 ppm, 200 ppm to 2000 ppm, 50 ppm to 500 ppm, 100 ppm to 500 ppm, 200 ppm to 1000 ppm, or 200 ppm to 500 ppm of the non-alloying impurities 120. In some embodiments, the concentration or amount of the impurities 120 through a conductive feature 206 is not uniform. For example, in some embodiments, the concentration or amount of impurities 120 might be higher near the bonding surface (e.g., the contact surface 104, shown in FIG. 4E) than in the bulk. A concentration or an amount of the impurities 120 can be measured by way of secondary ion mass spectrometry (SIMS), and/or transmission electron microscopy (TEM), such as a high resolution TEM (HR-TEM). The impurities 120 can be present both at the grain boundary 118 and within the grain 116 (shown, e.g., in FIGS. 2A-2C) of the conductive material 108 of the conductive feature 206 both prior to and after the annealing process.

SUMMARY

In one embodiment, an element can include a conductive feature at a contact surface of the element including a conductive material and an amount of impurities at a grain boundary of the conductive material, the impurities having a non-alloying material that does not form an alloy with the conductive material at a bonding temperature; and a nonconductive region at the contact surface in which the conductive feature is at least partially embedded.

In some embodiments, the impurities can include a metallic compound. In some embodiments, the impurities can include a metal oxide. In some embodiments, the impurities can include a non-metallic compound. In some embodiments, the impurities can include a non-metal oxide. In some embodiments, the impurities can include a chemical compound. In some embodiments, the conductive material can include copper. In some embodiments, the impurities can include a refractory material. In some embodiments, the impurities can include tantalum. In some embodiments, the impurities can include zirconium. In some embodiments, the impurities can include molybdenum. In some embodiments, the conductive feature can be configured such that grains of the conductive material grow slower than the conductive material without the impurities at room temperature. In some embodiments, the impurities can be disposed to cover 5% to 75% of grain boundaries of the conductive material. In some embodiments, the impurities can be disposed to cover 5% to 40% of grain boundaries of the conductive material. In some embodiments, the conductive feature can include 20 parts per million (ppm) to 5000 ppm of the impurities. In some embodiments, the conductive feature can include 200 parts per million (ppm) to 1000 ppm of the impurities. In some embodiments, the amount of impurities can be configured such that potential energy of the conductive material is maintained in a room temperature. In some embodiments, the conductive features can include 20 parts per million (ppm) to 5000 ppm of the impurities near the contact surface. In some embodiments, the conductive feature can include 200 parts per million (ppm) to 1000 ppm of the impurities near the contact surface. In some embodiments, the conductive feature can include a contact pad. In some embodiments, the conductive feature can include a through-substrate via (TSV). In some embodiments, the bonding temperature can be in a range of 100° C. to 250° C.

In another embodiment, a bonded structure can include a first element including a first conductive feature and a first nonconductive region at a first contact surface of the first element. The bonded structure can also include a second element including a second conductive feature directly bonded to the first conductive feature to define bonded conductive features, and a second nonconductive region directly bonded to the first nonconductive region. In some embodiments, the bonded conductive features can include a conductive material and a concentration of impurities, the impurities have a non-alloying material that does not form an alloy with the conductive material.

In some embodiments, the impurities can include a metallic compound. In some embodiments, the impurities can include a metal oxide. In some embodiments, the impurities can include a non-metallic compound. In some embodiments, the impurities can include a non-metal oxide. In some embodiments, the impurities can include a chemical compound. In some embodiments, the conductive material can include copper. In some embodiments, the impurities can include a refractory material. In some embodiments, the impurities can include tantalum. In some embodiments, the impurities can include zirconium. In some embodiments, the impurities can include molybdenum. In some embodiments, the conductive feature can be configured such that grains of the conductive material grow slower than the conductive material without the impurities at room temperature. In some embodiments, the conductive feature can include 20 parts per million (ppm) to 1000 ppm of the impurities. In some embodiments, the conductive feature can include 200 parts per million (ppm) to 1000 ppm of the impurities. In some embodiments, an amount of impurities can be configured such that potential energy of the conductive material is maintained in a room temperature.

In another embodiment, an element can be formed by: forming an opening in a dielectric material; providing a conductive material in the opening; providing non-alloying impurities at grain boundaries of the conductive material; and polishing a surface of the dielectric material and the conductive material.

In some embodiments, providing the non-alloying impurities can include providing a seed layer comprising the non-alloying impurities. In some embodiments, providing the non-alloying impurities can include co-depositing the non-alloying impurities with the conductive material. In some embodiments, providing the non-alloying impurities can include co-sputtering the non-alloying impurities with the conductive material. In some embodiments, the impurities can include a metallic compound. In some embodiments, the impurities can include a metal oxide. In some embodiments, the impurities can include a non-metallic compound. In some embodiments, the impurities can include a non-metal oxide. In some embodiments, the impurities can include a chemical compound. In some embodiments, the conductive material can include copper. In some embodiments, the impurities can include a refractory material. In some embodiments, the impurities can include tantalum. In some embodiments, the impurities can include zirconium. In some embodiments, the impurities can include molybdenum.

In another embodiment, a bonded structure can be formed by: providing a first element having a first conductive feature and a first nonconductive region at a first contact surface of the first element and a second element having a second conductive feature and a second nonconductive region at a second contact surface of the second element; directly bonding the first nonconductive region to the second nonconductive region without an intervening adhesive; and annealing to join the first conductive feature to the second conductive feature to form bonded conductive features. In some embodiments, the bonded conductive features can include a conductive material and a concentration of impurities, and the impurities can have a non-alloying material that does not form an alloy with the conductive material.

In some embodiments, the impurities can include a metallic compound. In some embodiments, the impurities can include a metal oxide. In some embodiments, the impurities can include a non-metallic compound. In some embodiments, the impurities can include a non-metal oxide. In some embodiments, the impurities can include a chemical compound. In some embodiments, the conductive material can include copper. In some embodiments, the impurities can include a refractory material. In some embodiments, the impurities can include tantalum. In some embodiments, the impurities can include zirconium. In some embodiments, the impurities can include molybdenum. In some embodiments, the conductive feature can be configured such that grains of the conductive material grow slower than the conductive material without the impurities at room temperature. In some embodiments, bonded conductive features can include 20 parts per million (ppm) to 1000 ppm of the impurities. In some embodiments, bonded conductive features can include 200 parts per million (ppm) to 1000 ppm of the impurities.

In another embodiment, a bonded structure can include a first element including a first conductive feature and a first nonconductive region at a first contact surface of the first element; and a second element including a second conductive feature directly bonded to the first conductive feature to define bonded conductive features, and a second nonconductive region directly bonded to the first nonconductive region. In some embodiments, a bonded surface area of the first element can be smaller than a bonded surface area of the second element, and a coefficient of thermal expansion (CTE) difference of a material of the first element and a material of the second element can be greater than 5 ppm/° C.

In some embodiments, the first conductive feature can include impurities.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An element comprising:
a conductive feature at a contact surface of the element including a conductive material and an amount of impurities at a grain boundary of the conductive material, the impurities having a material that does not form an alloy with the conductive material at 400° C.; and
a nonconductive region at the contact surface in which the conductive feature is at least partially embedded,
wherein the impurities are co-deposited with the conductive material such that a first concentration of the impurities near the contact surface of the conductive feature is similar to a second concentration of the impurities in an interior of the conductive feature.

2. The element of claim 1, wherein the impurities comprise a non-metallic compound.

3. The element of claim 1, wherein the conductive material comprises copper.

4. The element of claim 3, wherein the impurities comprise a refractory material.

5. The element of claim 3, wherein the impurities comprise tantalum.

6. The element of claim 3, wherein the impurities comprise zirconium.

7. The element of claim 3, wherein the impurities comprise molybdenum.

8. The element of claim 1, wherein the conductive feature is configured such that grains of the conductive material grow slower than the conductive material without the impurities at room temperature, and wherein a bonding temperature is in a range of 100° C. to 250° C.

9. The element of claim 1, wherein the impurities are disposed to cover 5% to 75% of grain boundaries of the conductive material.

10. The element of claim 1, wherein the conductive feature comprises 20 parts per million (ppm) to 5000 ppm of the impurities.

11. A bonded structure comprising:
a first element including a first conductive feature and a first nonconductive region at a first contact surface of the first element; and
a second element including a second conductive feature directly bonded to the first conductive feature to define bonded conductive features, and a second nonconductive region directly bonded to the first nonconductive region,
wherein the bonded conductive features include a conductive material and a concentration of impurities, the impurities comprising nanoparticles that do not form an alloy with the conductive material at 400° C.

12. The bonded structure of claim 11, wherein the nanoparticles comprise a non-metallic compound.

13. The bonded structure of claim 11, wherein the conductive material comprises copper.

14. The bonded structure of claim 13, wherein the nanoparticles comprise a refractory material.

15. The bonded structure of claim 13, wherein the nanoparticles comprise tantalum.

16. The bonded structure of claim 13, wherein the nanoparticles comprise zirconium.

17. The bonded structure of claim 13, wherein the nanoparticles comprise molybdenum.

18. The bonded structure of claim 11, wherein the conductive feature is configured such that grains of the conductive material grow slower than the conductive material without the nanoparticles at room temperature.

19. The element of claim 1, wherein the impurities do not form an alloy with the conductive material between 100° C. and 400° C.

20. The element of claim 1, wherein the impurities do not form an alloy with the conductive material at 250° C.

21. The element of claim 1, wherein the impurities do not form an alloy with the conductive material at 150° C.

22. The bonded structure of claim 11, wherein the nanoparticles do not form an alloy with the conductive material between 100° C. and 400° C.

23. The bonded structure of claim 11, wherein the nanoparticles do not form an alloy with the conductive material at 250° C.

24. The bonded structure of claim 11, wherein the nanoparticles do not form an alloy with the conductive material at 150° C.

25. The bonded structure of claim 11, wherein the impurities do not form an alloy with the conductive material at 400° C.

26. The element of claim 1, wherein the material of the impurities does not form an alloy with the conductive material at 400° C. during an annealing duration.

27. The bonded structure of claim 11, wherein the nanoparticles do not form an alloy with the conductive material at 400° C. during an annealing duration.

* * * * *